ional Research Development
United States Patent [19]

Wickramasinghe

[11] Patent Number: 4,741,620
[45] Date of Patent: May 3, 1988

[54] IRRADIATIVE PROBE SYSTEM

[75] Inventor: Hemantha K. Wickramasinghe, London, England

[73] Assignee: National Research Development Corporation, London, England

[21] Appl. No.: 883,444

[22] Filed: Jul. 14, 1986

Related U.S. Application Data

[63] Continuation of Ser. No. 539,408, Oct. 6, 1983, abandoned.

[30] Foreign Application Priority Data

Oct. 8, 1982 [GB] United Kingdom ............... 8228834

[51] Int. Cl.⁴ ............................................. G01B 9/02
[52] U.S. Cl. .................................... 356/349; 356/359
[58] Field of Search ............... 356/357, 349, 351, 354, 356/358, 359, 360, 352

[56] References Cited

U.S. PATENT DOCUMENTS

| | | | |
|---|---|---|---|
| 3,360,987 | 1/1968 | Flower et al. | 356/349 X |
| 3,796,495 | 3/1974 | Laub | 356/359 |
| 3,849,003 | 11/1974 | Velzel | 356/351 |
| 4,191,476 | 3/1980 | Pollard | 356/349 |
| 4,396,901 | 8/1983 | Saito et al. | 356/357 X |
| 4,422,764 | 12/1983 | Eastman | 356/359 |

FOREIGN PATENT DOCUMENTS

| | | |
|---|---|---|
| 0075032 | 3/1983 | European Pat. Off. . |
| 2254996 | 7/1975 | France . |
| 57-96207 | 6/1982 | Japan . |
| 80/00492 | 3/1980 | PCT Int'l Appl. . |
| 1194022 | 6/1970 | United Kingdom . |
| 2078978 | 1/1982 | United Kingdom . |

OTHER PUBLICATIONS

Pp. 54–57 of "Polarized Light Microscopy" by McCrone et al (Ann Arbor Science Publishers).

Whitman and Korpel: Applied Optics, vol. 8, No. 8, Aug. 1969, pp. 1567–1576.
De La Rue et al.: Proceedings of the Institution of Electrical Engineers, vol. 119, No. 2, Feb. 1972, pp. 117–126.
Bowers: Applied Physics Letters, vol. 41, No. 3, Aug. 1, 1982, pp. 231–233.
Thomson et al: Journal of Physics D: Applied Physics, vol. 6, 1973, pp. 677–687.
Adler et al: IEEE Transactions on Sonics and Ultrasonics, vol. SU-15, No. 3, Jul. 1968, pp. 157–161.
Lichte, H. "Ein Elektronen-Auflicht-Interenzmi Kroskop zur Prasizionsnessung von Unebenheiten und Potentialunterschieden auf Oberflachen": Optik, vol. 57, No. 1, Oct. 1980, pp. 35–67.
Lessor, D. et al. "Quantitative Surface Topography Determination by Normarski Reflection Microscopy. I. Theory": Journal of the Optical Society of America, vol. 69, No. 2, 1979, pp. 357–366.

Primary Examiner—Davis L. Willis
Assistant Examiner—Matthew W. Koren
Attorney, Agent, or Firm—Cushman, Darby & Cushman

[57] ABSTRACT

In a probe system which enables high sensitivity to be achieved in a differential phase contrast optical or electron microscope, a focused beam is periodically deflected over the surface of an object and resulting phase modulation of the beam (related to the phase structure of the object) is sensed. In one embodiment, the beam (18) is derived from a laser (10) and light reflected from the irradiated object (24) is received by a photodetector (26), where it interferes with a reference beam (28) also derived from the laser (10) but shifted in frequency by means of a Bragg cell (30); the detection system includes a vector voltmeter (40) sensing the amplitude and phase of a signal component at the deflection frequency. Also described are other optical embodiments utilizing different forms of interferometer and/or detection system, and an embodiment using an electron probe instead of a laser probe.

14 Claims, 4 Drawing Sheets

IRRADIATIVE PROBE SYSTEM

This is a continuation of application Ser. No. 539,408, filed Oct. 6, 1983, which was abandoned upon the filing hereof.

This invention relates to a probe system employing a beam of electromagnetic radiation, such as a laser beam, or a beam of electrons to irradiate a surface; the system can constitute part of a differential phase contrast microscope by means of which studies can be made of the surface structure of an object which is reflective to the beam or the phase structure of a thin object which is transparent to the beam.

In optical microscopy, such features have for example been studied by means of the Nomarski differential interference contrast system, such as described in pages 54–57 of "Polarized Light Microscopy" by McCrone et al (Ann Arbor Science Publishers Inc.). The optical arrangement relies on the use of polarisation techniques to derive phase information, and the output is essentially in the form of an optical image. At best this type of system has a phase sensitivity of about 5°, which in the case of investigations of surface topography corresponds to a height resolution of several tens of Å.

The present invention seeks to provide an improvement in this respect, by utilising techniques somewhat akin to ones which have been employed in the quite different field of investigation of acoustic surface perturbations. These known techniques involve the use of laser probes to derive electrical output signals related to the surface perturbations, various arrangements being described for example in the paper by Whitman and Korpel published in Applied Optics, vol. 8, No. 8, August 1969, pages 1567–1576 and the paper by De La Rue et al published in Proceedings of the Institution of Electrical Engineers, Vol. 119, No. 2, February 1972, pages 117–126. It should be emphasised that where acoustic surface perturbations are under investigation by such known techniques the effect of the topography of the unperturbed surface must be carefully eliminated from the electrical output signals; in contrast, the present invention is concerned with a system specifically designed to obtain information concerning inherent features (such as surface topography) of an object which is acoustically unperturbed.

According to the invention, a probe system comprises means for irradiating the surface of an object with a focused beam, deflection means for deflecting the beam in a manner corresponding to periodic motion over a limited region of said surface, and sensing means responsive to any phase modulation imposed on the beam by virtue of the periodic deflection of the beam causing it to interact with parts of the object exhibiting differences of phase structure.

The focused beam may be a beam of electromagnetic radiation, such as a laser beam, or may be a beam of electrons. The frequency of the periodic deflection of the beam will be very much lower than the optical or like frequency associated with the beam, but will usually be chosen to lie well above the range of frequencies associated with microphonics and thermal fluctuations. It will therefore normally not be less than 100 kHz and will typically be one or two orders of magnitude higher than this.

Where the probe system is utilised as part of a differential phase contrast microscope, it will normally be appropriate for said periodic motion to have a peak-to-peak magnitude of the same order as the width of the beam at its focus. In this application, it will also be normal further to provide a scanning system for causing relative movement (typically in the form of a television-type raster) between said surface and the mean position of the focused beam, the repetition frequencies involved in the scanning being much lower than the frequency of said periodic deflection of the beam. The scanning system may be of a mechanical type, for example moving the object while maintaining the probe system stationary, or may be of an electrically operated type involving deflection of the beam while maintaining the object stationary; in the latter case it will commonly be convenient to utilise part of said deflection means also as part of the scanning system. The scanning system will commonly be associated with a synchronously operated display system arranged to generate a picture controlled by the output of said sensing means.

Besides use as part of a microscope, various other applications are envisaged for a probe system according to the invention. These include use as part of a surface profile measuring instrument, for example to study the surface of an integrated circuit, use to monitor the growth of a coating on a substrate, and use as a read-out system for an optical data storage device in which information is stored in the form of discrete changes in the phase structure of a suitable recording medium.

Said sensing means may take various forms, and in particular may employ various heterodyne or homodyne techniques similar to ones that have been used in the investigation of acoustic surface perturbations by means of laser probes. This is exemplified in the description below of a number of embodiments of the invention.

In this description reference will be made to the accompanying drawings, in which.

Figure 1:
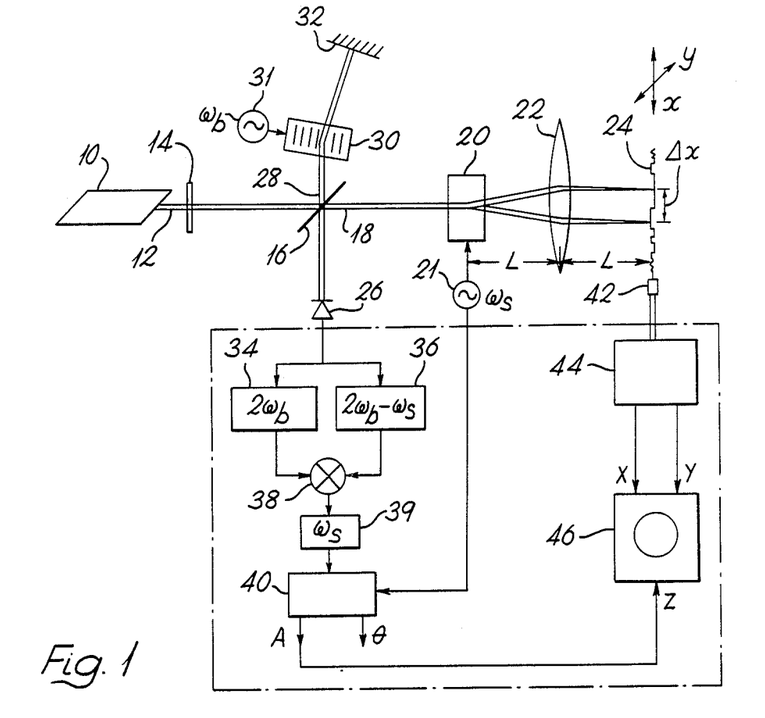
FIG. 1 is a diagrammatic illustration of an optical microscope incorporating a probe system according to the invention.

The microscope illustrated in FIG. 1 incorporates a laser interferometer in which an optical carrier signal is produced by means of a Bragg cell and a heterodyne technique is used to retrieve the required signal. A laser 10 produces a collimated beam 12 at angular frequency $\omega_o$ (an optical frequency) which passes through an isolator 14 to a beam splitter 16. The transmitted part of the beam, the illuminating beam 18, passes through a deflector 20, such as a fused quartz acousto-optic standing wave deflector, and through a microscope objective lens 22 which focuses the beam onto the surface of a sample 24, the lens 22 being spaced from this surface by a distance equal to its focal length L since the beam 18 is initially collimated. The deflector 20 is also spaced from the lens by the distance $L$, so that the beam falls on the sample surface at normal incidence throughout the range of deflection.

The deflector 20 is energised by a signal having an angular frequency $\omega_s$, derived from a source 21, so as to cause the beam to be repeatedly deflected to and fro across the sample surface, as indicated by the two illustrated extreme positions. The peak-to-peak magnitude of the deflection $\Delta x$ is typically made equal to the diameter on the surface of the focused beam, and is shown in highly exaggerated form for clarity. The beam reflected by the sample 24 returns along the same path as the illuminating beam 18, so as to pass again through the lens 22 and deflector 20 to the beam splitter 16 which reflects it to a photodiode 26.

The component of the beam 12 reflected by the beam splitter 16 as a reference beam 28 falls on a Bragg cell 30 energised by a signal of angular frequency $\omega_b$ derived from a source 31. The portion of the beam which is diffracted into the first order and upshifted in frequency to $(\omega_o+\omega_b)$ is arranged to be reflected back to the cell 30 by means of a fixed plane mirror 32; this portion constitutes about 90% of the power of the incident beam 28. A portion of the beam returned to the cell 30 by the mirror 32 is further upshifted in frequency to $(\omega_o+2\omega_b)$, this portion being directed back to the beam splitter 16 through which it is transmitted to the photodiode 26.

The output of the photodiode 26 is applied to two filters 34, 36, which respectively supply the inputs of a mixer 38 whose output is connected via a filter 39 to a vector voltmeter 40 which receives a reference signal from the source 21.

The sample 24 is held by a support 42 connected to an x-y scanner 44 which scans the surface in two dimensions in the focal plane of the lens 22. The scanner 44 provides x and y position signals to a display device 46, and the vector voltmeter 40 is also connected to the device 46.

As the focused beam is deflected across the surface of the sample 24, any variations in surface topography (or other differences of phase structure of the sample) over the deflection distance cause the beam reflected from the surface to be phase modulated at the deflection frequency $\omega_s$ and thus impose sidebands $(\omega_o\pm\omega_s)$ about the optical frequency $\omega_o$. The intensity of the sidebands is considerably lower than that of the main component of the reflected beam at frequency $\omega_o$.

The photodiode 26 therefore receives coherent beam components at frequencies $\omega_o$ and $(\omega_o\pm\omega_s)$ which interfere with the reference beam at frequency $(\omega_o+2\omega_b)$ so that the photodiode current includes components at the carrier frequence $2\omega_b$ and its sidebands $(2\omega_b\pm\omega_s)$. The filters 34, 36 respectively pass electrical signals at $2\omega_b$ and $(2\omega_b-\omega_s)$, the mixer 38 mixes the filtered signals, and the filter 39 recovers the component at the deflection frequency $\omega_s$. In the vector voltmeter 40, this component is compared in amplitude and phase with a reference signal at frequency $\omega_s$ derived directly from the source 21, the voltmeter 40 providing both an amplitude output A and a phase angle output $\theta$.

If $\Delta\phi$ is the variation in phase across the deflection distance $\Delta x$ on the sample surface, it can be shown that, provided $\Delta\phi<\pi/9$, the amplitude output A of the vector voltmeter 40 is approximately proportional to the phase gradient $\Delta\phi/\Delta x$. The phase output $\theta$ of the voltmeter 40 will be either 0 or $\pi$, depending on whether the phase gradient is positive or negative. Thus if the scanner 44 scans the sample 24 in a conventional raster pattern, and the amplitude output of the voltmeter 40 is used to brightness-modulate a scan-synchronised display on display device 46, then a phase gradient map of the sample 24 can be provided.

Figure 2:
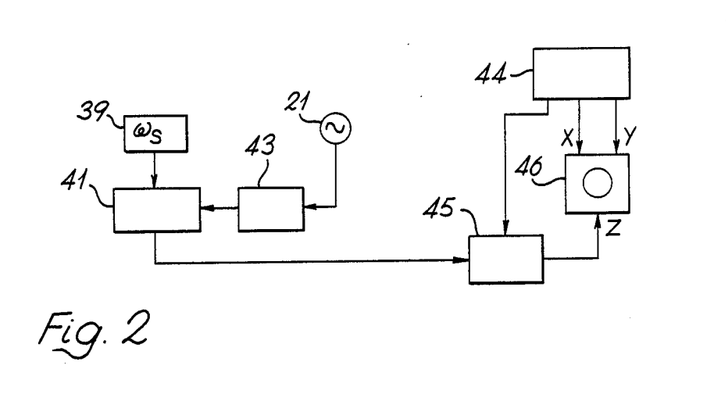
FIG. 2 is a diagram illustrating a modificatic of part of the microscope shown in FIG. 1.

If, however, a measurement of surface topography is required, then the video signal needed is $\int(\Delta\phi/\Delta x)\cos\theta\,dx$. If the line scan provided by the scanner 44 is aligned with the beam deflection $\Delta x$, then the required signal can be generated by performing the integral $\int A\cos\theta\,dt$ where t is time. FIG. 2 illustrates a modification of the FIG. 1 arrangement which can appropriately be used in this case. Here the vector voltmeter 40 is replaced by a phase sensitive detector 41 to which the output of the filter 39 is applied; a reference signal derived from the source 21 is fed to the detector 41 via a variable phase shifter 43 by means of which zero phase adjustment can be effected. Assuming the output of the filter 39 has the form $A\cos(\omega_s t+\theta)$ and the reference signal applied to the detector 41 has the form $C\cos(\omega_s t)$, it will be appreciated that the output of the detector 41 has the form $AC\cos\theta$. This output is applied to an integrating circuit 45, which is reset prior to the beginning of each scanning line by means of signals derived from the scanner 44, the output of the circuit 45 constituting the required video signal and being utilised to modulate the brightness of the display on the device 46.

It is an advantage of the use of the optical carrier at frequency $2\omega_b$ that the system is rendered insensitive to path length variations caused by microphonics and thermal fluctuations, provided their frequencies do not fall into the signal processing bandwidth, because such fluctuations alter the phase of the carrier $2\omega_b$ and the sideband $(2\omega_b-\omega_s)$ in precisely the same way and therefore cancel when mixed.

Considering now the detection sensitivity of the microscope, assume that the average power incident on the photodiode 26 if P and that this is divided equally between the two arms of the interferometer. The average photodiode current is therefore $$I_o = \frac{\eta P e}{\eta \omega_o},$$

where $\eta$ is the photodiode quantum efficiency, e is the electronic charge and n denotes Planck's constant divided by $2\pi$. In an ideal heterodyne situation, the peak current amplitude at the carrier frequency $2\omega_b$ will also be $I_o$. If R is the photodiode load resistance, the signal-to-noise ratio S/N of the carrier can be written as:

$$S/N = \frac{I_o^2 R/2}{(4KT\Delta f + 2eI_o\Delta fR)F} \quad (1)$$

where T is the absolute temperature, K is Boltzmann's constant, F is the overall noise factor, and $\Delta f$ is the system bandwidth. Provided $RI_o>>$ $$\frac{2KT}{e},$$

the thermal noise term in the denominator of equation (1) can be neglected and the S/N expression reduces to $$S/N = \frac{\eta P}{(4\eta\omega_o\Delta f)F} \quad (2)$$

In order to calculate the minimum detectable phase change $\Delta\phi_{min}$ the carrier amplitude at $2\omega_b$ must be related to the sideband amplitude at $(2\omega_b\pm\omega_s)$. The photodiode current takes the form B sin $$\left(2\omega_b t + \frac{\Delta\phi}{2}\sin\omega_s t\right).$$

Provided $\Delta\phi < \pi/9$ (which in the context of topographic measurements corresponds to height changes less than 1/36 of a wavelength) this expression simplifies to a carrier signal $B \sin 2\omega_b t$ and sideband signals $$\frac{B\Delta\phi}{4}[\sin(2\omega_b + \omega_s) - \sin(2\omega_b - \omega_s)].$$

Thus the sideband to carrier amplitude ratio is simply $\Delta\phi/4$. $\Delta\phi_{min}$ can be calculated by saying that the noise power in equation (2) corresponds to the minimum detectable sideband power; then:

$$\Delta\phi_{min} = \sqrt{\frac{64\eta\omega_o\Delta fF}{\eta P}} \quad (3)$$

Typical values using a He-Ne laser of wavelength 6328 Å are $P=50$ μW, $\eta=0.8$, $\Delta f=10$ KHz, $F=2$, $\omega_b/2\pi=25$ MHz, $\omega_s/2\pi=1.7$ MHz. Equation (3) predicts $\Delta\phi_{min}=10^{-4}$ radians, which would correspond to a topographical height variation $\Delta H_{min}$ of $5\times 10^{-2}$ Å. The estimated spatial resolution using a 10× microscope objective lens is 1.4 micrometres.

With the embodiment illustrated in FIG. 1 a problem may arise if there is a variation in the reflectivity of the sample surface, which will cause variations in signal amplitude. The problem may be overcome by normalising the amplitude of the signal with respect to the amplitude of the component of the photodiode current at frequency $2\omega_b$, which varies in the same way with sample reflectivity; the necessary modifications to the circuit of FIG. 1 are not illustrated since they will readily be apparent to those skilled in the art, particularly having regard to FIG. 5 of the paper by De La Rue et al referred to above. In an alternative arrangement (not illustrated) the problem can be dealt with by replacing the components 34, 36 and 38 shown in FIG. 1 by a frequency-modulation demodulator which detects the phase modulation of the signal at frequency $\omega_s$ in the photodiode output, the demodulator output being integrated and fed via the filter 39 to the vector voltmeter 40.

Figure 3:
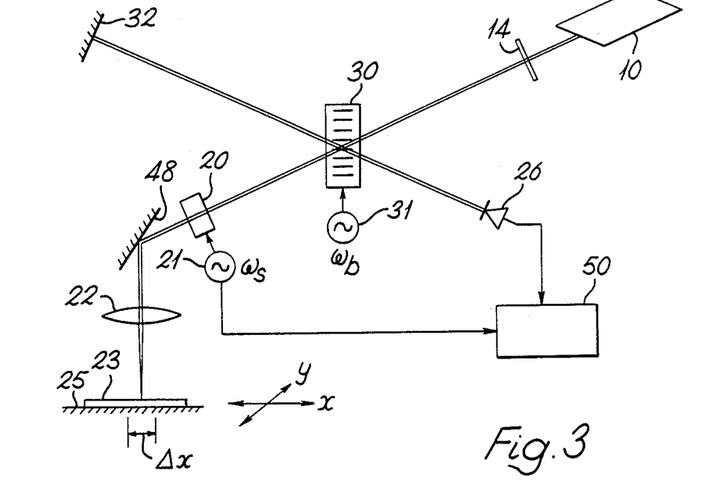
FIGS. 3–6 are diagrammatic illustrations of four further optical microscopes incorporating probe systems according to the invention.

A variation of the FIG. 1 embodiment is shown in FIG. 3, with identical reference numerals used for duplicated items of apparatus. The Bragg cell 30 is now used also as a beam splitter. The illuminating beam at frequency $\omega_o$ transmitted by the Bragg cell 30 passes through the deflector 20 and is reflected by a plane mirror 48 through the lens 22 and through a thin transmissive test object 23 to a further plane mirror 25 which supports the object. The optical disposition of the lens 22 relative to the deflector 20 and the object 23 is similar to that for the lens 22 in the FIG. 1 embodiment. The modulated beam having components at frequencies $\omega_o$ and $(\omega_o \pm \omega_s)$ returns by this same route to the Bragg cell 30 which downshifts it in frequency by $\omega_b$ and directs it to the photodiode 26. The reference beam at frequency $(\omega_o + \omega_b)$ diffracted by the cell 30 is reflected by plane mirror 32 to pass a second time through the cell 30 without any frequency change, and is also incident on the photodiode 26. In this case, the interference at the photodiode 26 takes place between a beam of frequency $(\omega_o + \omega_b)$ and a beam having components of frequencies $(\omega_O - \omega_b)$ and $(\omega_o \pm \omega_s - \omega_b)$; the photodiode current thus again has components at the frequencies $2\omega_b$ and $(2\omega_b \pm \omega_s)$. The reference 50 denotes an arrangement similar to that indicated within the broken lines in FIG. 1, incorporating signal detection, scanning and display systems. If desired this arrangement could of course again be modified as shown in FIG. 2.

Figure 4:
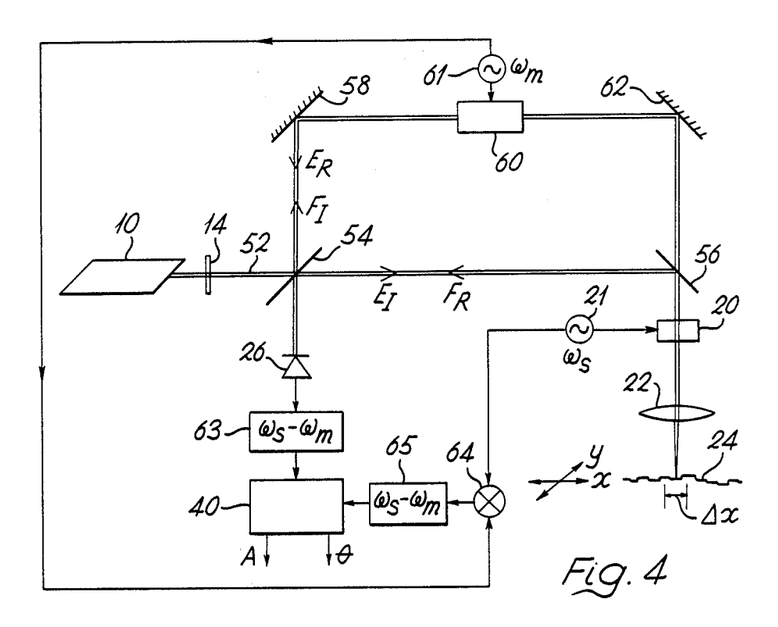

A third embodiment utilising a heterodyne technique is illustrated in FIG. 4. In this case the laser source 10 provides a beam 52 which is divided by a beam splitter 54 into equal components $E_I$ and $F_I$. The transmitted component $E_I$ is reflected by a further beam splitter 56 to the deflector 20. The deflector 20 in this case may suitably be a standing wave Bragg cell, with the signal generated by the source 21 such that $\omega_s/2\pi$ is about 50 MHz. The reflected component $F_I$ is reflected by a plane mirror 58 through a phase modulator 60 to a further plane mirror 62 which reflects it through the beam splitter 56 to the deflector 20; the modulator 60 is energised by a signal of angular frequency $\omega_m$ derived from a source 61, suitably such that $\omega_m/2\pi$ is about 0.5 MHz. The paths travelled by the beam components $E_I$ and $F_I$ are such that the path difference is greater than the coherence length of the laser 10; it is also important that the path difference should correspond to a transmission time difference equal to an odd multiple of one half of the period of the signal of frequency $\omega_s$. The beam components $E_I$ and $F_I$ pass through the deflector 20 and lens 22 to be reflected by the surface of the sample 24, the optical arrangement of these elements being as before, and the beam splitter 56 causes part of each component to return along each of the two routes to the beam splitter 54; the difference in path lengths is, however, such that there is interference only between the part ($E_R$) of the reflected component derived from $E_I$ which travels the longer route through the phase modulator 60 and the part ($F_R$) of the reflected component derived from $F_I$ which travels the shorter route to beam splitter 54. Both $E_R$ and $F_R$ will of course pass once through the modulator 60, and both will be phase modulated at the frequency $\omega_s$ by virtue of the operation of the deflector 20; they will accordingly both include components at frequencies $\omega_o$ and $(\omega_o \pm \omega_m \pm \omega_s)$, so that the photodiode current will inculde inter alia a component at the frequency $(\omega_s - \omega_m)$. This component is selected by means of a filter 63, whose output is applied to a vector voltmeter 40 where it is compared in amplitude and phase with a reference signal at the frequency $(\omega_s - \omega_m)$; the reference signal is derived by applying signals from the sources 21 and 61 to a mixer 64 and selecting the difference frequency component by means of a filter 65. The output of the voltmeter 40 is utilised in the same manner as for the FIG. 1 embodiment, and a scanning and display arrangement similar to that indicated in FIG. 1 is again provided (being omitted from FIG. 4 for the sake of simplicity).

In a variation (not illustrated) of the FIG. 4 embodiment, the two optical paths can be defined by optical fibres, using suitable coupling components in place of the beam splitters 54 and 56; the optical arrangement would then be similar to that disclosed in the article by Bowers published in Applied Physics Letters, Vol. 41, No. 3, 1 August 1982, pages 231-233.

Figure 5:
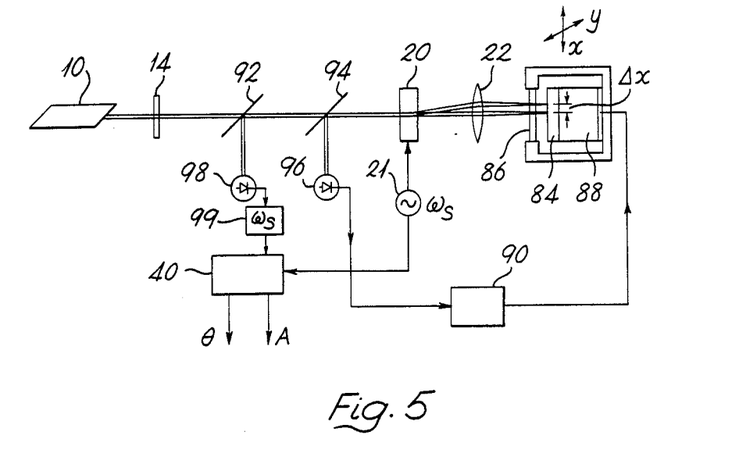

Turning now to arrangements utilisng homodyne techniques, FIG. 5 illustrates a further optical embodiment in which the principle of the Fabry-Perot interferometer is applied. A test object 84 which is highly reflecting is spaced from a parallel partial mirror 86 to form a Farby-Perot etalon. The object 84 is supported by a piezoelectric pusher 88 connected to a comparator circuit 90.

The beam from laser 10 passes through a first beam splitter 92 and a second beam splitter 94 which is a 1% reflector to the deflector 20 and objective lens 22 which provide the deflection Δx and focus the beam on to the reflecting object 84 in a similar manner to that involved in the earlier embodiments.

Light reflected by the etalon 84, 86 passes to the beam splitter 94 which reflects 1% of the received beam to a photodiode 96 connected to the comparator circuit 90. This circuit is provided with an internal reference voltage and is arranged to control the piezoelectric pusher 88 to keep the etalon spacing constant. A description of a suitable circuit can be found in an article by Thomson et al published in Journal of Physics D: Applied Physics, Vol. 6, 1973, pages 677–687. The circuit continually monitors the spacing of the etalon and maintains it at the required part of the resonance curve, i.e. at the position of maximum slope and maximum sensitivity.

The remainder of the beam passes to the beam splitter 92 which reflects a partial beam to a photodiode 98. As a result of the phase modulation imposed on the beam by virtue of the operation of the deflector 20, the photodiode current includes a component at the deflection frequency $\omega_s$, which may suitably be such that $\omega_s/2\pi$ has a value of the order of one MHz; this component is recovered by means of a filter 99 and fed to a vector voltmeter 40 which operates in the same manner as for the FIG. 1 embodiment. A scanning and display arrangement similar to that used in the FIG. 1 embodiment is again provided, but is omitted from the drawing for the sake of simplicity.

In this embodiment the very small beam focus requires a very small spacing between the two reflecting surfaces of the etalon to be provided, because the diameter increases with the multiple reflection.

Figure 6:
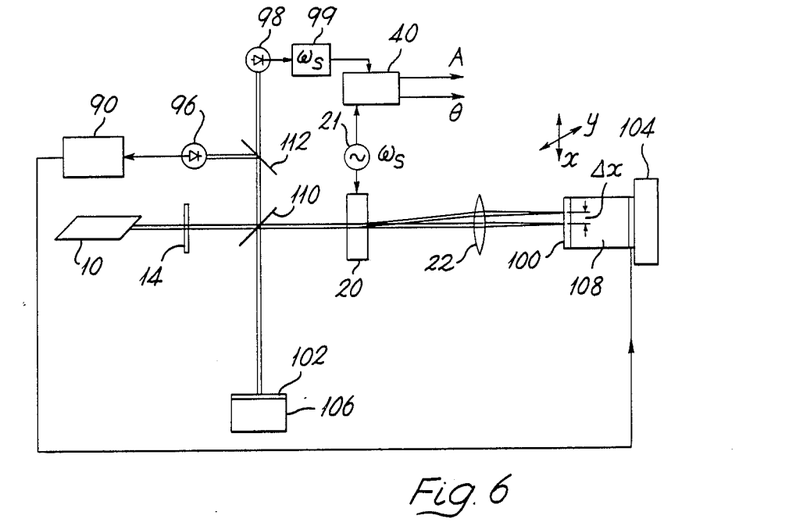

In a variation illustrated in FIG. 6, based on a Michelson interferometer, the two reflecting surfaces 100, 102 are separated in space. Both are supported on respective tilt stages 104, 106, while the variable mirror 100 is directly carried by a piezoelectric pusher 108. The mirror 102 is fixed.

The beam from laser 10 passes through a 99.9% reflecting beam splitter 110 and through the deflector 20 and objective lens 22 to the test surface 100. The return beam is reflected by the 99.9% reflector 110 to the second reflecting surface 102, giving a multiply reflecting system. A beam component passes to a 1% reflector 112 which transmits a beam to a photodiode 98 connected as before to a detection system incorporating a filter 99 and a vector voltmeter 40. The reflected fraction passes to a photodiode 96 connected to a comparator circuit 90 which controls the piezoelectric pusher 108 and maintains the system at the position of maximum sensitivity.

The advantage of the FIG. 6 embodiment over that illustrated in FIG. 5 is that the deflector 20 is within the interferometer system, and the beam can be focused directly on the object and deflected across it.

Any of the microscopes described above can of course be used to study either the surface topography of a reflecting object or the phase structure of a thin transmissive object backed by a plane mirror.

Figure 7:
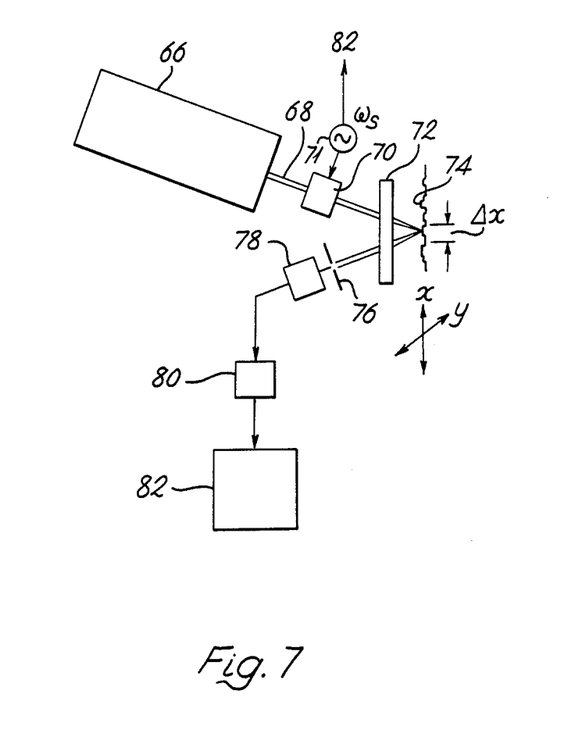
FIG. 7 is a diagrammatic illustration of an electron microscope incorporating a probe system according to the invention.

FIG. 7 illustrates an embodiment using an electron probe instead of a laser probe. A source 66 provides a collimated electron beam 68 which passes through an electron deflector 70 (energised by a signal at the frequency $\omega_s$ derived from a source 71) and through an electron focusing lens 72 to an electron mirrored reflecting substrate 74. Electrons reflected by the surface pass through the lens 72 and through a limiting aperture 76 to an electron detector 78 connected through a filter 80 to a processing and display circuit 82.

As in the optical embodiment, the focused electron beam is scanned across the surface 74 at frequency $\omega_s$ by a distance of the same order as the diameter of the focused beam. The value of $\omega_s$ is chosen so that it is outside the frequency range of thermal fluctuations and microphonics, and may suitably be such that $\omega_s/2\pi$ has a value of about one MHz. Variations in the topography of the scanned surface give rise to modulation of the beam at the frequency $\omega_s$ as a result of deflection of the beam relative to the aperture 76 and/or changes in the degree of focus of the beam at this aperture. The filter 80 recovers the resultant $\omega_s$ signal component in the output of the detector 78, and it is compared in the circuit 82 with the amplitude and phase of a reference signal derived from the source 71. The surface 74 is scanned slowly in the x and y directions to allow a point-by-point picture to be built up from the compared signals.

It will be appreciated that an electron beam can be focused to a smaller spot size than a laser beam, so that resolution can be improved by use of the FIG. 7 arrangement. The principles of this arrangement can however, also be used in an optical microscope if desired.

The arrangement illustrated in FIG. 7 is in fact similar in principle to an optical device used to detect surface acoustic waves described by Adler et al in a paper published in IEEE Transactions on Sonics and Ultrasonics, Vol. SU-15, No. 3, July 1968, pages 157–161. In a variation (not illustrated) similar to another arrangement described in that paper, the limiting aperture is replaced by a knife edge normal to the direction of deflection of the beam, when topographical variations in the deflection direction result in signal changes.

I claim:
1. A probe system comprising:
   irradiating means for irradiating the surface of an object with a focused beam;
   deflection means for deflecting said beam in a manner corresponding to periodic motion over a limited region of said surface; and
   sensing means for deriving an output representative of the value of phase modulation imposed on said beam by virtue of the periodic deflection of said beam causing it to interact with parts of said object exhibiting differences of phase structure, the sensing means being arranged to receive both first signals carrying said phase modulation and second signals representative of the periodic deflection, and arranged to derive said value of phase modulation from the said first and second signals.

2. A probe system according to claim 1, in which said irradiating means comprises a laser and means for deriving said focused beam from said laser, and said sensing means comprises a photodetector arranged to receive said focused beam after its interaction with said object and means for deriving a further beam from said laser and for directing said further beam to said photodetector so as to interfere at said photodetector with said focused beam.

3. A probe system according to claim 2 wherein the means for deriving a further beam comprises
a beam splitter,
a Bragg cell situated in the path of the said further beam,
means for energising the Bragg cell at an angular frequency $w_b$ and
mirror means for reflecting the said further beam to the said photodetector, and
wherein the sensing means includes
first filter means, connected to the said photodetector, passing a signal having a frequency dependant on the said angular frequency $w_b$ only,
second filter means, connected to the said photodetector, passing a signal having a frequency dependent only on the said angular frequency $w_b$, and the frequency of the said periodic motion, and
mixer means for combining the outputs of the first and second filter means to derive a signal representative of any said phase modulation imposed on the said beam.

4. A probe system according to claim 2 wherein the means for deriving a further beam comprises
a Bragg cell situated in the beam from the generating means between the generating means and the deflecting means to split the further beam from the beam from the generating means,
means for energising the Bragg cell at an angular frequency $w_b$, and
mirror means for reflecting the said further beam to the said photodetector, and
wherein the sensing means includes
first filter means, connected to the said photodetector, passing a signal having a frequency dependent on the said angular frequency $w_b$ only,
second filter means, connected to the said photodetector, passing a signal having a frequency dependent only on the said angular frequency $w_b$ and the frequency of the said periodic motion, and
mixer means for combining the outputs of the first and second filter means to derive a signal representative of any said phase modulation imposed on the said beam.

5. A probe system according to claim 1, in which said deflection means includes means for causing said periodic motion to have a peak-to-peak magnitude of the same order as the width of said beam at its focus.

6. A differential phase contrast microscope comprising:
irradiating means for irradiating the surface of an object with a focused beam;
deflection means for deflecting said beam in a manner corresponding to periodic motion over said surface with a peak-to-peak magnitude of the same order as the width of said beam at its focus;
sensing means responsive to any phase modulation imposed on said beam by virtue of the periodic deflection of said beam causing it to interact with parts of said object exhibiting differences of phase structure;
scanning means for causing a regular pattern of relative movement between said surface and the mean position of said beam; and
display means for generating, synchronously with the operation of said scanning means, a picture controlled by the output of said sensing means.

7. A probe system comprising
means for generating a beam of radiation,
deflecting means arranged to cause the point of incidence of the beam on a surface to execute periodic motion over a limited region of said surface, and
sensing means for deriving an output representative of the value of phase modulation imposed on the beam by virtue of the periodic motion of said point of incidence causing the beam to interact with parts of the object exhibiting differences of structure, the sensing means being arranged to receive both first signals carrying said phase modulation and second signals representative of the periodic deflection, and arranged to derive said value of phase modulation from the said first and second signals.

8. A probe system according to claim 7 wherein
the means for generating the said beam is a laser,
the said beam reaches the deflection means by a first path,
the means for generating a beam of radiation generates a further beam and passes the said further beam to the deflecting means by a second path, the first and second paths being of different lengths and having a path length difference which is greater than the coherence length of the said laser and corresponds to a transmission time difference equal to an odd multiple of one half period of the said periodic motion,
the sensing means receiving the first mentioned beam by way of the second path and the said further beam by way of the first path,
the probe system comprising a phase modulator situated in the second path and employing an angular modulation frequency $w_m$, and
the sensing means including a photodetector and filter means connected thereto arranged to pass only signals at a frequency dependent on the said angular frequency $w_m$ and the frequency of the said periodic motion.

9. A probe system according to claim 7 wherein
the sensing means includes an interferometer, positioned to receive the said beam, having two, at least partially reflecting, spaced apart surfaces one of which is the said surface, and
means for controlling the position of one of the said two surfaces in accordance with light received from the interferometer to maintain the interferometer at maximum sensitivity.

10. A probe system comprising:
irradiating means for irradiating the surface of an object with a focused beam;
deflection means for deflecting said beam in a manner corresponding to periodic motion over a limited region of said surface; and
sensing means responsive to any phase modulation imposed on said beam by virtue of the periodic deflection of said beam causing it to interact with parts of said object exhibiting differences of structure, said deflection means including means for causing said periodic motion to have a peak-to-peak magnitude of the same order as a width of said beam at its focus.

11. A probe system comprising:
a laser and means for irradiating the surface of an object with a focused light beam derived from said laser;

deflection means for deflecting said beam in a manner corresponding to periodic motion over a limited region of said surface; and sensing means responsive to any phase modulation imposed on said beam by virtue of the periodic deflection of said beam causing it to interact with parts of said object exhibiting differences of structure, said sensing means comprising a photodetector arranged to receive said focused beam after its interaction with said object and means for deriving a further beam from said laser and for directing said further beam to said photodetector so as to interfere with said focused beam at said photodetector; wherein said means for deriving a further beam comprises
 a beam splitter,
 a Bragg cell situated in the path of the said further beam,
 means for energizing the Bragg cell at an angular frequency $w_b$, and
 mirror means for reflecting said further beam to the said photodetector; and wherein the sensing means includes
 first filter means, connected to said photodetector, for passing a signal having a frequency dependent only on said angular frequency $w_b$,
 second filter means, connected to said photodetector, for passing a signal having a frequency dependent only on said angular frequency $w_b$ and the frequency of the said periodic motion, and
 mixer means for combining the outputs of the first and second filter means to derive a signal representative of any said phase modulation imposed on the said beam.

12. A probe system comprising:
a laser, and means for irradiating the surface of an object with a focused light beam derived from said laser;

deflection means for deflecting said beam in a manner corresponding to periodic motion over a limited region of said surface; and sensing means responsive to any phase modulation imposed on said beam by virtue of the periodic deflection of said beam causing it to interact with parts of said object exhibiting differences of structure, said sensing means comprising a photodetector arranged to receive said focused beam after its interaction with said object and means for deriving a further beam from said laser and for directing said further beam to said photodetector so as to interfere with said focused beam at said photodetector; wherein the means for deriving a further beam comprises
 a Bragg cell situated in the beam from the generating means between the generating means and the deflecting means to split the further beam from the beam from the generating means,
 means for energizing the Bragg cell at an angular frequency $w_b$, and
 mirror means for reflecting the said further beam to the said photodetector, and wherein the sensing means includes
 first filter means, connected to said photodetector, for passing a signal having a frequency dependent only on the said angular frequency $w_b$,
 second filter means, connected to said photodetector, passing a signal having a frequency dependent only on said angular frequency $w_b$ and the frequency of said periodic motion, and
 mixer means for combining the outputs of the first and second filter means to derive a signal representative of any said phase modulation imposed on said beam.

13. A probe system comprising
a laser for generating a light beam;
deflecting means arranged to cause a point of incidence of the light beam on the surface of an object to execute periodic motion over a limited region of said surface; and
sensing means responsive to any phase modulation imposed on the beam by virtue of the periodic motion of said point of incidence causing the beam to interact with parts of the object exhibiting differences of structure, wherein
said beam reaches the deflection means by a first path,
said laser generates a further light beam and passes said further beam to the deflecting means by a second path, the first and second paths being of different lengths and having a path length difference which is greater than a coherence length of the said laser and corresponds to a transmission time difference equal to an odd multiple of one half period of said period motion,
the sensing means receiving the first mentioned beam by way of the second path and said further beam by way of the first path,
the probe system comprising a phase modulator situated in said second path and employing an angular modulation frequency $w_m$, and
the sensing means including a photodetector and filter means connected thereto arranged to pass only signals at a frequency dependent on the said angular frequency $w_m$ and the frequency of said periodic motion.

14. A probe system comprising
means for generating a beam of radiation,
deflecting means arranged to cause a point of incidence of the beam on a surface of an object to execute periodic motion over a limited region of the said surface, and
sensing means responsive to any phase modulation imposed on the beam by virtue of the periodic motion of the said point of incidence causing the beam to interact with parts of the object exhibiting differences of structure, wherein
the sensing means includes an interferometer, positioned to receive said beam, having two, at least partially reflecting, spaced apart surfaces, one of which is said surface, and
means for controlling the position of one of the said two surfaces in accordance with light received from the interferometer to maintain the interferometer at maximum sensitivity.

* * * * *